(12) United States Patent
Cronin et al.

(10) Patent No.: US 6,530,412 B1
(45) Date of Patent: Mar. 11, 2003

(54) SURFACE MOUNT TECHNOLOGY WITH MASKED CURE

(75) Inventors: John E. Cronin, Saint Albans, VT (US); Joseph D. Poole, Troutman, NC (US); Michael C. Weller, Harrisburg, NC (US)

(73) Assignee: International Business Machines Corporation, Armonk, NY (US)

( * ) Notice: Subject to any disclaimer, the term of this patent is extended or adjusted under 35 U.S.C. 154(b) by 189 days.

(21) Appl. No.: 09/599,300

(22) Filed: Jun. 21, 2000

Related U.S. Application Data

(62) Division of application No. 09/175,916, filed on Oct. 20, 1998, now Pat. No. 6,139,661.

(51) Int. Cl.⁷ .............................. B32B 31/28; H05K 3/32
(52) U.S. Cl. ................. 156/378; 156/379.7; 156/380.9; 257/783; 361/760
(58) Field of Search ........................... 156/379.6, 379.7, 156/380.9, 64, 378; 438/15, 119; 29/832, 842; 257/783; 361/760, 763, 767, 783; 174/260

(56) References Cited

U.S. PATENT DOCUMENTS

| | | |
|---|---|---|
| 4,811,081 A | 3/1989 | Lyden |
| 4,999,136 A | 3/1991 | Su et al. |
| 5,068,714 A | 11/1991 | Seipler |
| 5,237,130 A | 8/1993 | Kulesza et al. |
| 5,261,156 A | 11/1993 | Mase et al. |
| 5,310,840 A | 5/1994 | Willett et al. |
| 5,543,724 A | 8/1996 | Christopher |
| 5,545,281 A | 8/1996 | Matsui et al. |
| 5,620,795 A | 4/1997 | Haak et al. |

*Primary Examiner*—Michael W. Ball
*Assistant Examiner*—Todd J. Kilkenny
(74) *Attorney, Agent, or Firm*—Schmeiser, Olsen & Watts; Lawrence R. Fraley

(57) ABSTRACT

A method for temporarily attaching an electrical component to a pad, testing the component, removing and replacing the component if necessary, and making a final attachment of the component to the pad. The method provides for attachment and removal of components, to and from pads located on the substrate of a printed circuit board, wherein the method enables components to be easily removed prior to final assembly without damaging the circuit board or components mounted thereon. The method utilizes a layer of conductive, radiation-curable adhesive placed between the component's lead and the pad. Radiation is then directed through a mask onto a portion of the adhesive layer, which cures the portion while leaving a remaining area of the adhesive layer uncured. Because the portion of the adhesive layer that receives the radiation, and is consequently cured by the radiation, is only a limited portion of the whole adhesive layer, the component may be easily removed from the pad by applying a small mechanical force. Following such removal, the component or a replacement thereof may be attached to the remaining area. The final stage of the method cures the remaining area of uncured adhesive by exposing the remaining area to radiation.

19 Claims, 3 Drawing Sheets

SURFACE MOUNT TECHNOLOGY WITH MASKED CURE

This application is a divisional of U.S. Ser. No. 09/175,916 filed Oct. 20, 1998, now U.S. Pat. No. 6,139,661.

BACKGROUND OF THE INVENTION

1. Technical Field

The present invention relates to a surface mount technology (SMT) techniques for fabricating printed circuit boards, and more specifically to a method and structure for temporarily attaching an electrical component to a pad located on a substrate of a printed circuit board, testing the component, removing and replacing the component if necessary, and making a final attachment of the component to the pad.

2. Related Art

Printed circuit boards are typically configured with many electronic components in close proximity with one another. While a given component may have passed a test for acceptability prior to its attachment to the circuit board, the component may not function properly after attachment due to attachment of a wrong component, a defective attachment, a misplaced attachment, a misorientation following attachment, or an erroneous interaction of the component with the overall electronic package. When an attached component is identified as not functioning properly, corrective action may require removal of such component. Thus, after all required components are mounted on a printed circuit board and the overall system is tested, the result of the testing may indicate that one or more components need to be removed and either replaced or reattached.

Prevailing methods in surface mount technology ("SMT") for attaching and removing components utilize a heat source such as a soldering iron or hot air in conjunction with a solder paste that joins a component to a pad on a substrate of the circuit board. Such methods for removing components are time-consuming and costly, because the heat injected into the component-pad interface will, on occasion, cause damage to neighboring components as well as to the circuit board itself. In addition, the process of manually removing small components requires a fair amount of expertise. Thus, there is a need for a method that enables components on the substrate of a circuit board to be quickly and easily removed after in-line testing in a way that poses little risk of damage to the circuit board assembly.

SUMMARY OF THE INVENTION

The present invention provides a method of attachment and removal of components to and from pads located on the substrate of a printed circuit board, wherein the method enables components to be easily removed prior to final assembly without damaging the circuit board or components mounted thereon. The present invention temporarily joins components and pads by, for example, positioning a layer of electrically conductive adhesive ("adhesive layer") between the component's lead and the pad, wherein the adhesive is curable by exposure to radiation. Temporary attachment may be accomplished by directing a beam of radiation onto only a portion of the adhesive layer ("tack area") in order to cure only the tack area, wherein the tack area comprises a limited area of contact between the component's lead and the adhesive layer. Since the tack area comprises a only a limited area of the adhesive layer's surface area, the curing of the tack area creates a temporary attachment inasmuch as the user may subsequently remove the component, if necessary, by a small application of force without damaging the remaining area of uncured adhesive.

One method of directing radiation onto the tack area includes the use of a mask which causes the beam of radiation to cure only the tack area while leaving a remaining area of the adhesive layer uncured. The mask may comprise an opaque sheet with a hole, wherein the opaque sheet comprises material that is opaque to the beam of radiation, and wherein a portion of the beam passes through the hole onto the tack area.

Following temporary attachment of all required components to the substrate, the overall circuit board configuration may be tested. If the testing dictates that a component should be removed, the user may easily remove the component and either replace or reattach it. The final stage of the procedure cures the remaining area of adhesive by exposing the remaining area to radiation.

The present invention has the advantage of attaching a component lead to a pad by utilizing a radiation-curable, conductive adhesive layer between the component and the pad.

The present invention has the advantage of temporarily attaching a component to a pad by fastening only a portion of the component's lead, rather than the whole lead, to the pad.

The present invention has the advantage of attaching a component to a pad by using radiation to cure the conductive adhesive layer that links the component to the pad.

The present invention has the advantage of utilizing a mask to cause radiation to strike a tack area of the adhesive layer while leaving the remaining area of adhesive uncured.

The present invention has the advantage of using a mask comprising an opaque sheet with a hole, wherein the opaque sheet comprises material that is opaque to the beam of radiation, and wherein a portion of the beam passes through the hole onto the tack area.

DETAILED DESCRIPTION OF THE PREFERRED EMBODIMENT

Figure 1:
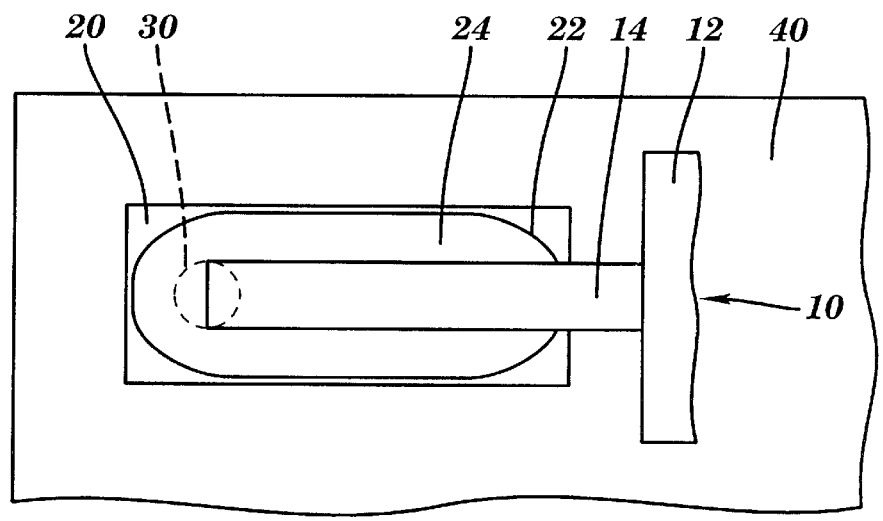
FIG. 1 depicts a top view of a substrate containing a component, a pad, an adhesive layer, and a tack area in accordance with a preferred embodiment of the present invention.
Figure 2:
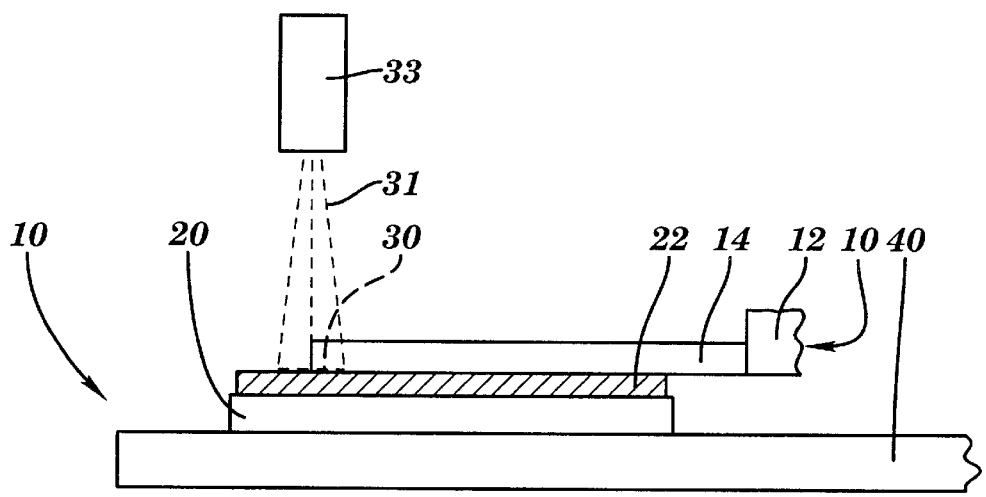
FIG. 2 depicts a cross-sectional side view of the arrangement depicted in FIG. 1.

FIG. 1 depicts a top view of a substrate 40 having a component 10. The process of this invention performs an electrical and mechanical attachment of the component 10 to a pad 20 located on the substrate 40. FIG. 2 is a cross-sectional side view of the arrangement depicted in FIG. 1. The component 10, which comprises a body 12 and a lead 14, may be any type of electrical component typically found in electronic devices, such as semiconductor chips, capacitors, resistors, and switches. Substrate 40 generally comprises a printed circuit board but could be any type of substrate that receives electrical components. In the preferred embodiment of the present invention, the component 10 is attached to the pad 20 with a layer 22 of curable conductive adhesive between the lead 14 and the pad 20. The process of attachment has two stages. In the preferred embodiment, stage 1 creates a temporary attachment by curing a "tack area" 30 of the adhesive layer 22, which constitutes a small percentage of the surface area of the adhesive layer 22. A 5 to 10% tack area is estimated to be sufficient for establishing an adequate electrical and mechanical connection. The size of the tack area, however, may vary with the particular application. Stage 2 creates a final attachment by curing the "remaining area" 24 of the adhesive layer 22, which is the portion of the adhesive layer 22 that is not cured in stage 1. Thus, the "remaining area" comprises the adhesive layer 22 less the tack area 30. It should be understood that attachment of the component 10 to the pad 20 in the two-step process of the present invention is not limited to the use of a curable adhesive and that any means of attachment could be utilized.

During stage 1, the lead 14 is attached to the pad 20 by first applying a layer 22 of conductive adhesive between the lead 14 and the pad 20. This attachment is made temporary by curing only a small portion of the adhesive layer 22, namely the tack area 30, so that the component 10 can be easily removed and replaced by itself or another component (not shown) after stage 1, if necessary. A temporary, rather than final, attachment in stage 1 enables the component 10 to be tested while it is electrically and mechanically connected to the pad 20. Subsequent to the testing, the component 10 may be removed with little mechanical force, if so dictated by the result of the testing, while maintaining the integrity of the remaining area 24 of uncured adhesive. While removal of the component 10 may render the tack area 30 unusable for subsequent attachment of itself 10 or of another component to the pad 20, the removal will not prevent such subsequent attachment to the remaining area 24 of uncured adhesive. If the tack area 30 is a sufficiently small percentage of the adhesive layer 22 (e.g., 10%), then the remaining area 24 of uncured adhesive provides adequate surface area (e.g., 90%) for subsequent attachment of the same or another component to the pad 20.

Figure 5:
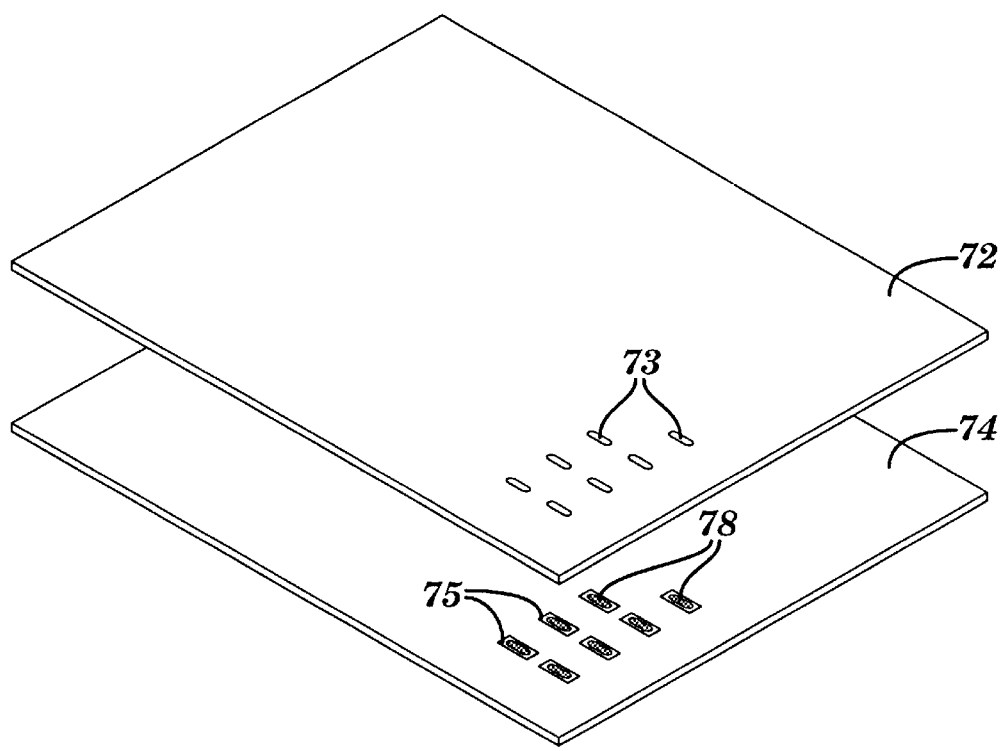
FIG. 5 depicts a stencil having apertures for applying adhesive to selected portions of a substrate, in accordance with an embodiment of the present invention.

The process of performing the stage 1 attachment includes the following steps. First, electrically conductive adhesive is applied to the surface of the pad 20, thereby creating an adhesive layer 22 on the surface of the pad 20. In the preferred embodiment, the electrically conductive adhesive may include a material such as that described in U.S. Pat. No. 4,999,136 (Wei-Fang et al., Aug. 23, 1988, herein incorporated by reference) that is curable by exposure to ultraviolet radiation for approximately eight seconds. Referring to FIG. 5, applying adhesive to a pad may be accomplished in the preferred embodiment by (1) placing a stencil 72 with apertures 73 upon a substrate 74 with pads 75 such that the apertures 73 overlay the pads 75, and (2) applying an adhesive material on the stencil 72 such that it will pass through the apertures 73 and onto the pad 75 to create adhesive layers 78. The step of applying the adhesive material onto the stencil 72 may be accomplished in any manner, such as with "squeegee" or silk screening type mechanisms.

Returning to FIGS. 1 and 2, after adhesive is applied to the pad 20, the component 10 is set on the substrate 40 by placing the lead 14 on the tack area 30. In practice, the tack area 30 should be as small a fraction of the adhesive layer 22 as possible, yet large enough to permit both an electrical connection and a temporary mechanical connection to be formed between the lead 14 and the adhesive layer 22. Next, the tack area 30 is cured by a process that leaves the remaining area 24 of the adhesive layer 22 uncured. Curing may be accomplished by utilizing a source of radiation 33 which releases a focused beam of radiation 31 onto the tack area 30 for at least the period of time required for curing. The radiation is of a type that conforms to the curing characteristics of the electrically conductive adhesive and comprises ultraviolet light when the adhesive is one such as that described in U.S. Pat. No. 4,999,136. Alternatively, the electrically conductive adhesive could be of a type that is cured by exposure to radiation outside of the ultraviolet range of the electromagnetic spectrum.

Figure 3:
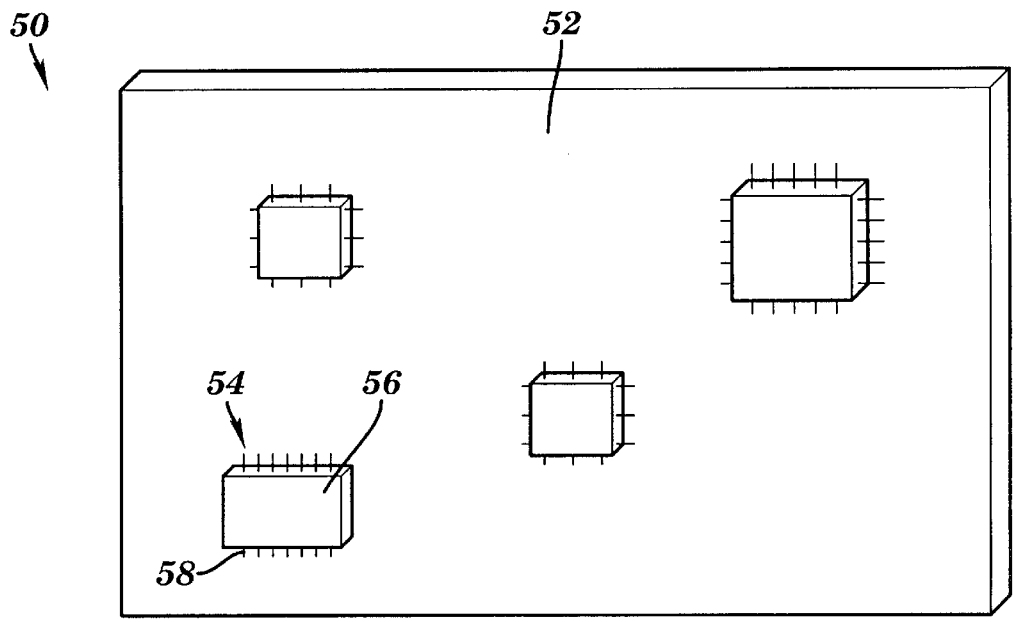
FIG. 3 depicts a printed circuit board comprising a substrate with components thereon.
Figure 4:
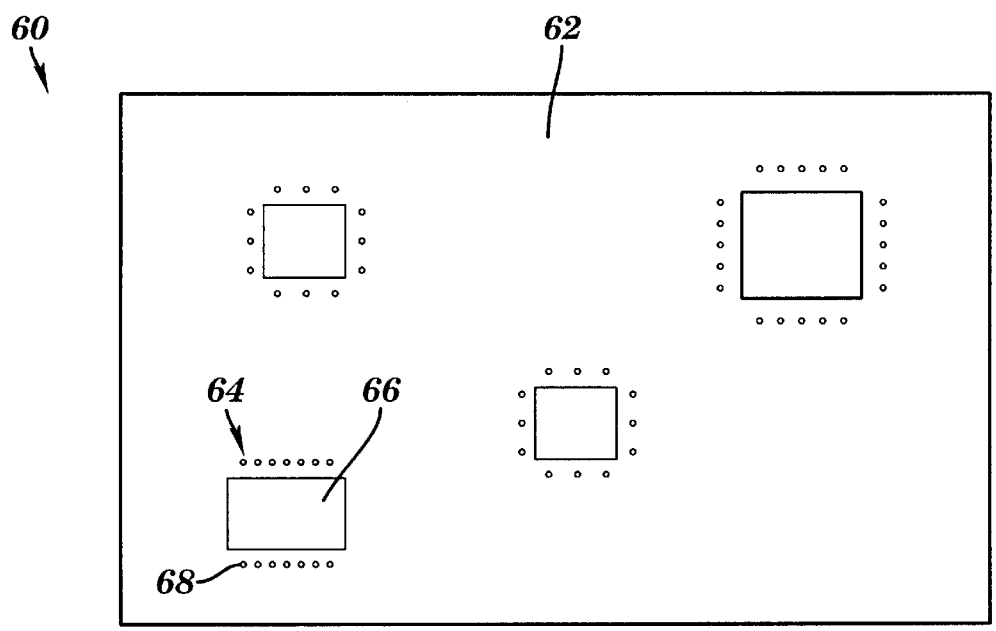
FIG. 4 depicts a mask for use with the printed circuit board of FIG. 3 in accordance with a preferred embodiment of the present invention.

The preceding curing step must cure only the tack area 30, leaving the "remaining area" 24 uncured, so that the remaining area 24 will be available for reattaching the component 10 or attaching its replacement (not shown) should the component 10 be removed after stage 1. The preferred embodiment may achieve this selective spatial curing by using a mask for selectively passing radiation to the tack area 30. FIG. 4 depicts an example of a mask 60 for use with the printed circuit board 50 shown in FIG. 3. The printed circuit board 50 in FIG. 3 comprises a substrate 52 and components 54, where each component 54 has a body 56 and one or more leads 58. The particular configuration in FIG. 3 of four components is shown for illustrative purposes only and any configuration of components could be utilized. Generally, the number and placement of components 54, along with the number of leads 58 on each component 54, depends on the particular application. The specific printed circuit board configuration 50 utilizes a mask 60 that facilitates attachment of components 54 to the substrate 52 pursuant to the described two-stage process. The mask 60 in FIG. 4 may comprise a sheet of non-transparent material 62 with cutout regions 64. Each cutout region 64 consists of a cutout area 66 and cutout holes 68. Each cutout region 64 of the mask 60 in FIG. 4 corresponds to a component 54 on the substrate 52 in FIG. 3 such that the number of cutout regions 64 equals the number of components 54. The mask 60 of FIG. 4 is intended to overlay the printed circuit board 50 of FIG. 3 such that: (1) each cutout area 66 provides an opening through which the corresponding component body 56 may protrude and (2) each cutout hole 68 exposes a tack area of the adhesive layer suitable for providing a temporary connection between each lead 58 and a the corresponding pad, as shown in FIGS. 1 and 2. Accordingly, the curing step of stage 1 is accomplished by overlaying the mask 60 on the printed circuit board 50 and passing radiation onto the mask 60 for the required curing time, so that the radiation is transmitted onto only the tack areas. This exposure to radiation cures the tack areas and leaves the remaining area of each adhesive layer uncured. The mask 60 may then be removed.

As described, stage 1 cures the tack area 30 rather than the entire adhesive layer 22 in FIG. 1. A mask with cutout regions, such as the mask depicted in FIG. 4, provides a basis for curing the tack area 30 alone. However, any method or mechanism for performing a partial cure could be utilized. For example, an alternative mask design could comprise a sheet of transparent material selectively covered with non-transparent material, so as to form separated transparent regions through which radiation may be selectively transmitted. The tack area may also be cured without a mask by focusing a beam of radiation (e.g., via laser technology) on the tack area for the required period of time. With this non-mask alternative, each tack area on the printed circuit board may be cured individually in contrast with the simultaneous curing of all tack areas when a mask is used.

After completion of stage 1, the printed circuit board 50 may be tested with all components 54 electrically and mechanically temporarily connected to the substrate 52. If the testing identifies a component 54 that should be removed, due to malfunction, improper attachment, or for any other reason, the user may easily remove the component 54 with a minimal use of mechanical force. The removed component 54 may be replaced by itself or by another component (not shown) by placing the leads of the replacement component on the remaining areas of the adhesive layers on the pad.

In stage 2, the component leads 58 are attached to the pads on the substrate 52 by curing the remaining area of all adhesive layers on the substrate 52. In the preferred embodiment, this curing is done by directing radiation onto the entire substrate 52 for the required curing time. This exposure to radiation cures the remaining area associated with each lead 58. This curing of all adhesive on the substrate creates a final attachment of the components 54 to the pads on the substrate 52.

While preferred and particular embodiments of the present invention have been described herein for purposes of illustration, many modifications and changes will become apparent to those skilled in the art. For example, while the preferred embodiment utilizes a curable adhesive to achieve temporary attachment, it is recognized that non-curable adhesives or other connection systems could likewise be employed. Thus, temporary attachments may be achieved, for example, with heat-based or chemical-based reactions. Accordingly, the appended claims are intended to encompass all such modifications and changes as fall within the true spirit and scope of this invention.

We claim:

1. A system, comprising:
   an adhesive layer that includes an electrically conductive adhesive, wherein the adhesive layer is disposed between a lead and a pad so as to be in physical contact with both the lead and the pad and to form an electrical connection between an electrical component and the pad, wherein the electrical component comprises the lead; and
   means for curing a tack area of the adhesive layer, wherein the tack area comprises a first portion of an area of contact between the lead and the adhesive layer, wherein said means does not cure a remaining area of the adhesive layer, and wherein the remaining area includes a second portion of the area of contact.

2. The system of claim 1, wherein the tack area comprises five to ten percent of the adhesive layer's surface area.

3. The system of claim 1, wherein the means for curing the tack area includes a mask and a beam of radiation passing through the mask and striking the tack area.

4. The system of claim 1, wherein the means for curing the tack area includes means for focusing a beam of radiation on the tack area.

5. The system of claim 1, wherein the means for curing the tack area forms a temporary mechanical bond between the pad and the lead.

6. The system of claim 1, further comprising means for testing the component.

7. The system of claim 1, further comprising means for removing the component while maintaining the integrity of the remaining area.

8. An electrical structure, comprising:
   a pad;
   an adhesive layer on the pad, wherein the adhesive layer includes an electrically conductive adhesive, and wherein the adhesive layer includes:
      a tack area that is being cured or has been cured, and
      a remaining area that is uncured; and
   a component comprising a lead, wherein the lead is in contact with the adhesive layer so as to form an electrical connection between the component and the pad, wherein the tack area includes a first portion of an area of contact between the lead and the adhesive layer, and wherein the remaining area includes a second portion of the area of contact.

9. The electrical structure of claim 8, wherein the tack area comprises about five percent to about ten percent of the adhesive layer's surface area.

10. The electrical structure of claim 8, wherein the tack area is being cured by a radiation.

11. The electrical structure of claim 10, wherein the radiation includes ultraviolet radiation.

12. The electrical structure of claim 10, wherein the radiation is being passed through a mask and onto the tack area but not onto the remaining area.

13. The electrical structure of claim 8, wherein the tack area has been cured, and wherein the contact between the lead and the adhesive layer includes a temporary mechanical bond between the pad and the lead.

14. The electrical structure of claim 8, further comprising a printed circuit board, wherein the pad is on the printed circuit board.

15. The electrical structure of claim 8, further comprising an electronic device that includes the component.

16. The electrical structure of claim 15, wherein the electronic device is selected from the group consisting of a semiconductor chip, a capacitor, a resistor, and a switch.

17. The electrical structure of claim 15, wherein the electronic device is selected from the group consisting of a capacitor, a resistor, and a switch.

18. An electrical structure, comprising:
   a pad;
   an adhesive layer on the pad and wholly within an outer boundary of the pad, wherein the adhesive layer includes an electrically conductive adhesive, wherein the adhesive covers a portion of the pad and wherein the adhesive layer includes:
      a tack area that is being cured or has been cured, and
      a remaining area that is uncured; and
   a component comprising a lead, wherein the lead is in contact with the adhesive layer so as to form an electrical connection between the component and the pad, wherein the tack area includes a first portion of an area of contact between the lead and the adhesive layer, and wherein the remaining area includes a second portion of the area of contact.

19. The electrical structure of claim 18, wherein the tack area comprises about five percent to about ten percent of the adhesive layer's surface area.

* * * * *